(12) United States Patent
Favreau et al.

(10) Patent No.: US 11,497,118 B2
(45) Date of Patent: Nov. 8, 2022

(54) METHOD FOR MANUFACTURING NON-PLANAR ARRAYS WITH A SINGLE FLEX-HYBRID CIRCUIT CARD

(71) Applicant: RAYTHEON COMPANY, Waltham, MA (US)

(72) Inventors: Channing Paige Favreau, Barre, MA (US); James E. Benedict, Lowell, MA (US); Mikhail Pevzner, Woburn, MA (US); Thomas V. Sikina, Acton, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 17/174,904

(22) Filed: Feb. 12, 2021

(65) Prior Publication Data

US 2022/0264745 A1   Aug. 18, 2022

(51) Int. Cl.
*H05K 1/02* (2006.01)
*H05K 1/11* (2006.01)
*H05K 3/32* (2006.01)
*H05K 3/46* (2006.01)

(52) U.S. Cl.
CPC ............. *H05K 1/118* (2013.01); *H05K 1/028* (2013.01); *H05K 3/326* (2013.01); *H05K 3/4691* (2013.01)

(58) Field of Classification Search
CPC ........ H05K 1/118; H05K 1/028; H05K 3/326; H05K 3/4691
USPC ......................................................... 174/254
See application file for complete search history.

(56) References Cited

U.S. PATENT DOCUMENTS

| 6,927,344 | B1  | 8/2005  | Gall et al. |
| 8,520,392 | B2* | 8/2013  | Johann .................. H05K 1/189 |
|           |     |         | 361/720 |
| 9,119,317 | B2  | 8/2015  | Primavera |
| 2012/0032286 | A1 | 2/2012 | Trusov et al. |
| 2020/0343927 | A1 | 10/2020 | Welsh et al. |

FOREIGN PATENT DOCUMENTS

| JP | 2016515714 A | 5/2016 |
| WO | 2007132300 A1 | 11/2007 |

OTHER PUBLICATIONS

International Search Report and Written Opinion in corresponding International Patent Application No. PCT/US2021/062919 dated Apr. 20, 2022.
Zotov, S. A. et al. "Folded MEMS Pyramid Inertial Measurement Unit," IEEE Sensors Journal, 2011, vol. 11, No. 11, pp. 2780-2789.

* cited by examiner

*Primary Examiner* — Tremesha S Willis
(74) *Attorney, Agent, or Firm* — Lando & Anastasi, LLP

(57) ABSTRACT

A method of fabricating a printed circuit assembly includes providing a flexible-hybrid circuit having a base and at least one side panel. The at least one side panel is hingedly connected to the base. The method further includes disposing a support structure on the flexible-hybrid circuit. The support structure includes a base, which is disposed on the base of the flexible-hybrid circuit, and at least one side that corresponds to the at least one side panel of the flexible-hybrid circuit. The method further includes folding the at least one side panel of the flexible-hybrid circuit so that the at least one side panel is disposed co-planar with the at least one side of the support structure to create a printed circuit assembly.

19 Claims, 10 Drawing Sheets

METHOD FOR MANUFACTURING NON-PLANAR ARRAYS WITH A SINGLE FLEX-HYBRID CIRCUIT CARD

GOVERNMENT RIGHTS

This invention was made with government support. The government has certain rights in the invention.

BACKGROUND

Multidirectional arrays, which are non-planar, and are small in size, are incapable of being manufactured using existing design and manufacturing techniques. A typical missile system radar system, such as the radar system illustrated in FIG. 1, are planar, with passive antennas that are installed on gimbals.

SUMMARY

One aspect of the present disclosure is directed to a method of fabricating a printed circuit assembly. In one embodiment, the method comprises: providing a flexible-hybrid circuit having a base and at least one side panel, the at least one side panel being hingedly connected to the base; disposing a support structure on the flexible-hybrid circuit, the support structure including a base, which is disposed on the base of the flexible-hybrid circuit, and at least one side that corresponds to the at least one side panel of the flexible-hybrid circuit; and folding the at least one side panel of the flexible-hybrid circuit so that the at least one side panel is disposed co-planar with the at least one side of the support structure to create a printed circuit assembly.

Embodiments of the method further may include configuring the base of the support structure to have a three-sided base and the at least one side of the support structure has three three-sided sides that together form the shape of a three-sided pyramid. The flexible-hybrid circuit may include a three-sided base panel that is sized and shaped to receive the base of the support structure and three three-sided side panels that are sized and shaped to be receive on respective sides of the support structure. The base panel and each side panel of the flexible-hybrid circuit may be fabricated from a PCB, with each side panel being hingedly connected to the base panel by flexible-hybrid circuits that provide electrical and mechanical connections. Each hinge may include a thin insulating polymer film having conductive circuit patterns affixed thereto and typically supplied with a thin polymer coating to product the conductor circuits. The method further may include securing the at least side panel of the flexible-hybrid circuit to the at least one side of the support structure by one or more fasteners. The support structure may include one or more components. The one or more components may include at least one waveguide and optionally one of a sensor, auxiliary electronics, a gyroscope or a cooling module. The base of the support structure may include a polynomial-sided base and the at least one side of the support structure may include a corresponding polynomial-sided sides that together form the shape of a three-dimensional object. The flexible-hybrid circuit may include a polynomial-sided base panel that is sized and shaped to receive the polynomial-sided base of the support structure and a corresponding number of polynomial-sided side panels that are sized and shaped to be received on respective sides of the support structure. The base panel and each side panel of the flexible-hybrid circuit may be fabricated from a PCB, with each side panel being hingedly connected to the base panel by flexible-hybrid circuits that provide electrical and mechanical connections.

Another aspect of the present disclosure is directed to a printed circuit assembly comprising a flexible-hybrid circuit having a base and at least one side panel, the at least one side panel being hingedly connected to the base, and a support structure on the flexible-hybrid circuit. The support structure includes a base, which is disposed on the base of the flexible-hybrid circuit when assembling the flexible-hybrid circuit and the support structure, and at least one side that corresponds to the at least one side panel of the flexible-hybrid circuit. The at least one side panel of the flexible-hybrid circuit is configured to be folded so that the at least one side panel is disposed co-planar with the at least one side of the support structure to create the printed circuit assembly.

Embodiments of the assembly further may include configuring the base of the support structure to have a three-sided base and the at least one side of the support structure includes three three-sided sides that together form the shape of a three-sided pyramid. The flexible-hybrid circuit may include a three-sided base panel that is sized and shaped to receive the base of the support structure and three three-sided side panels that are sized and shaped to be receive on respective sides of the support structure. The base panel and each side panel of the flexible-hybrid circuit may be fabricated from a PCB, with each side panel being hingedly connected to the base panel by flexible-hybrid circuits that provide electrical and mechanical connections. Each hinge may include a thin insulating polymer film having conductive circuit patterns affixed thereto and typically supplied with a thin polymer coating to product the conductor circuits. The support structure may include one or more components. The one or more components may include one of a sensor, auxiliary electronics, a gyroscope or a cooling module. The base of the support structure may include a polynomial-sided base and the at least one side of the support structure may include a corresponding polynomial-sided sides that together form the shape of a three-dimensional object, and wherein the flexible-hybrid circuit includes a polynomial-sided base panel that is sized and shaped to receive the polynomial-sided base of the support structure and a corresponding number of polynomial-sided side panels that are sized and shaped to be received on respective sides of the support structure. The base panel and each side panel of the flexible-hybrid circuit may be fabricated from a PCB, with each side panel being hingedly connected to the base panel by flexible-hybrid circuits that provide electrical and mechanical connections.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION

Figure 1:
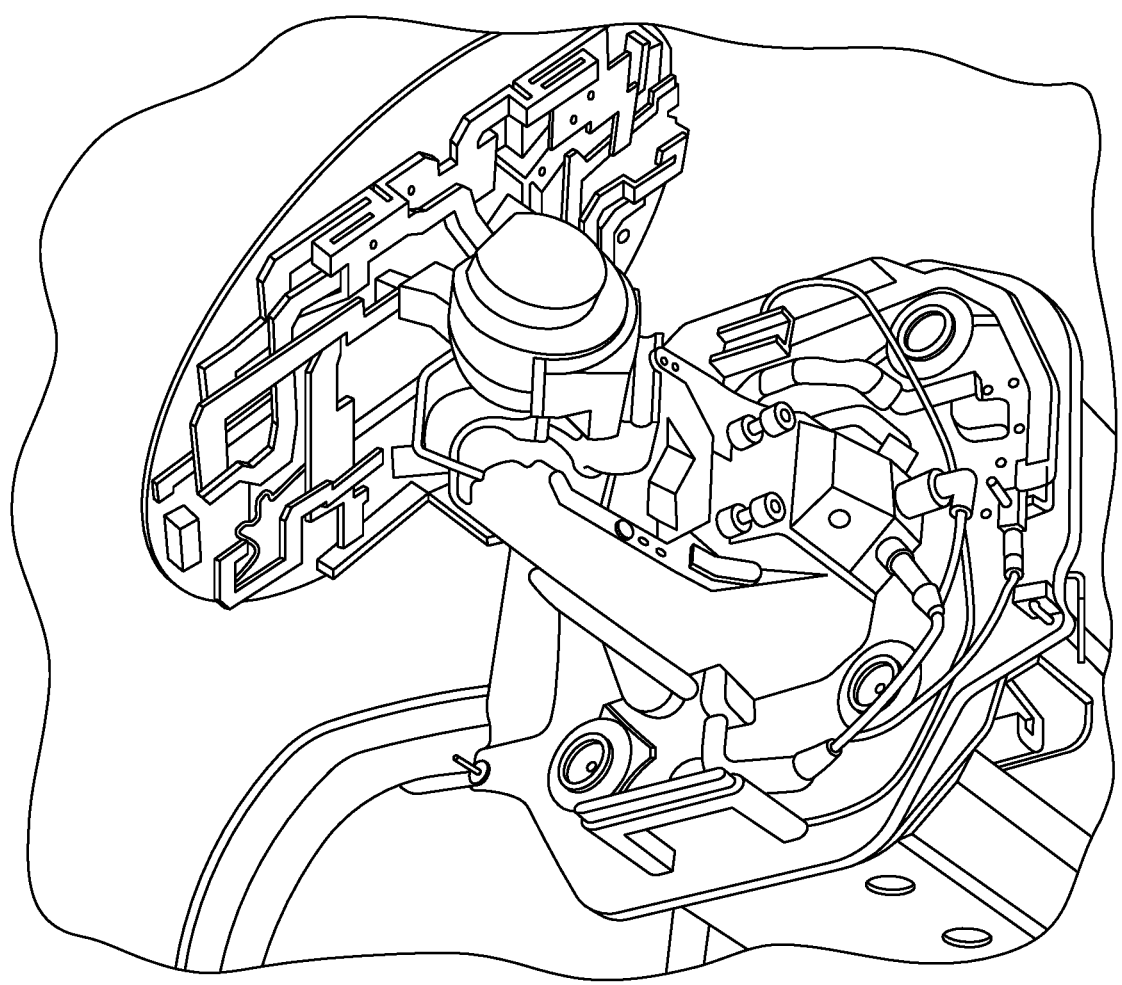
FIG. 1 is a perspective view of a typical missile and projectile radar system.

Embodiments of the present disclosure are directed to a foldable flexible-hybrid circuit card assembly (CCA) that combines a standard printed circuit board (PCB) and a flexible circuit card assembly technology can be built as a single circuit card and folded to conform to a predetermined three-dimensional structure, e.g., a pyramid, with integrated waveguides without additional interconnects, and enabling multi-directional transmit-receiving capability.

In one embodiment, an integrated waveguide structure provides radio frequency (RF) interconnection, thermal management, and structure for an antenna. Conformal faceted antennas minimize scattering, and the flexible-hybrid circuit provide direct current (DC) power and logic interconnection from the facet antenna to a combiner board. The combination of flexible-hybrid and waveguide connections enables manufacturing without a need for miniature connectors that are difficult or impossible to assemble a tilted antenna to maintain a larger field of view.

Any of the above example techniques and/or others may be combined to make various electromagnetic components and/or circuits. Aspects and examples of such techniques are described and illustrated herein with respect to a radio frequency interconnect to contain and convey an electromagnetic signal along a layer of an electromagnetic circuit in one dimension and vertically through to other layers of the circuit in another dimension. The techniques described herein may be used to form various electromagnetic components, connectors, circuits, assemblies, and systems.

It is to be appreciated that embodiments of the processes discussed herein are not limited in application to the details of construction and the arrangement of components set forth in the following description or illustrated in the accompanying drawings. The processes are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and processes or their components to any one positional or spatial orientation.

The term "radio frequency" or "RF" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, processes in accord with those described herein may be suitable for handling non-ionizing radiation at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

In some embodiments, the resulting circuit board structure is merely an example and portion of a structure in which an electromagnetic circuit may be provided. Further extent of the substrates shown may accommodate various circuit components, and additional substrates having additional layers to accommodate additional circuit components may be provided in various embodiments. Typically, a portion of a circuit may be disposed on a particular layer, and may include ground planes above and/or below, and other portions of a total circuit (or system) may exist at different regions of the same layer or on other layers.

Figure 2A:
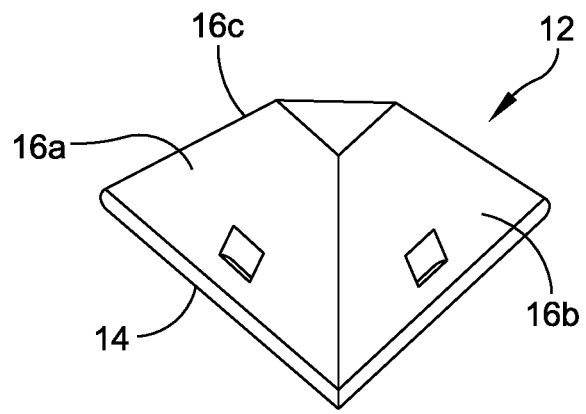
FIG. 2A is a perspective view of a structural support used to manufacture a non-planar array of the present disclosure.
Figure 2B:
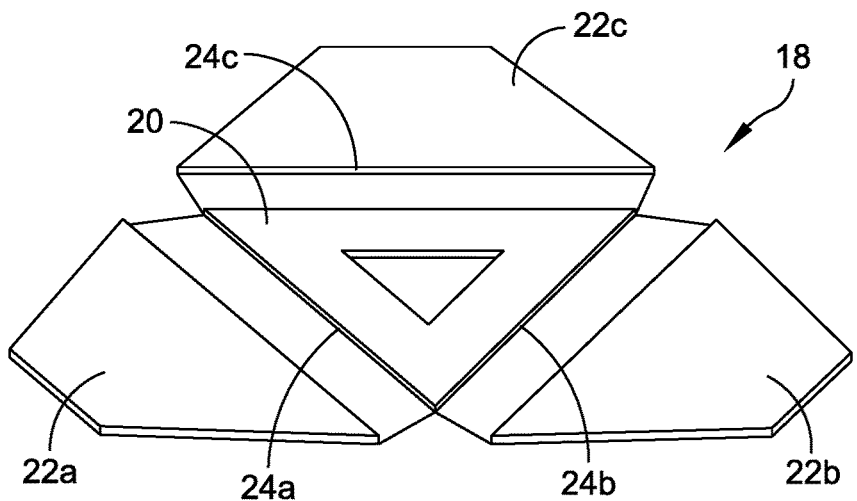
FIG. 2B is a perspective view of a flexible-hybrid circuit used to manufacture the non-planar array.
Figure 2C:
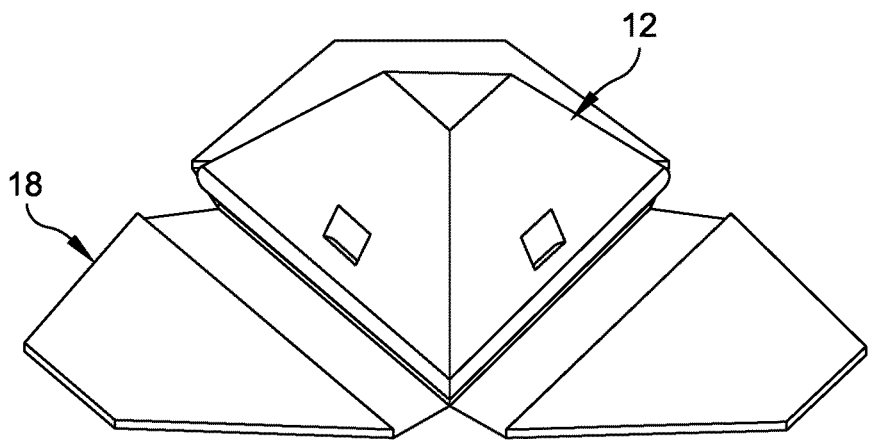
FIG. 2C is a perspective view of the flexible-hybrid circuit prior to being folded about the structural support.
Figure 2D:
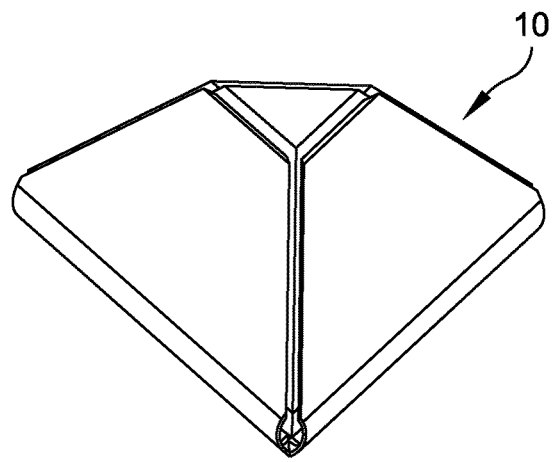
FIG. 2D is a perspective view of flexible-hybrid circuit folded about the structural support to create a flexible-hybrid circuit assembly.

Referring to the drawings, and particularly to FIGS. 2A-2D, a non-planar, e.g., three-dimensional, flexible-hybrid circuit assembly or array is generally indicated at 10 in FIG. 2D. In FIG. 2A, a pyramidic-shaped support structure is generally indicated at 12. In some embodiments, the support structure 12 may be referred to as a support mold. As shown, the support structure 12 is a three-sided pyramid; however, as will be apparent, the shape and size of the support structure 12 can be varied and still fall within the scope of the present disclosure. Specifically, the support structure 12 includes a three-sided base 14 and three three-sided sides 16a, 16b, 16c that form the shape of the pyramid.

In FIG. 2B, a flexible-hybrid circuit is generally indicated at 18. As shown, the flexible-hybrid circuit 18 is shaped to fold about the support structure. Specifically, the flexible-hybrid circuit 18 includes a three-sided base panel 20 that is sized and shaped to receive the base 14 of the support structure 12 and three three-sided side panels 22a, 22b, 22c that are sized and shaped to be received on respective sides 16a, 16b, 16c of the support structure. In one embodiment, the base panel 20 and the side panels 22a, 22b, 22c of the flexible-hybrid circuit 18 are fabricated from a PCB, with each side panel being hingedly connected to the base panel by flexible circuit hinges 24a, 24b, 24c that provide electrical and mechanical connections between the panels.

Flexible circuits, which are sometimes referred to as "flex circuits," can include a thin insulating polymer film having conductive circuit patterns affixed thereto and typically supplied with a thin polymer coating to protect the conductor circuits. The circuits can be formed by etching metal foil cladding (normally of copper) from polymer bases, plating metal or printing of conductive inks among other processes. The flexible-hybrid circuits disclosed herein can be optionally configured to have electronic components attached to the circuits.

In FIG. 2C, the support structure 12 is placed on the flexible-hybrid circuit 18, with the base 14 of the support structure being placed on the base panel 20 of the flexible-hybrid circuit. As shown, the base panel 20 of the flexible-hybrid circuit 18 is sized to generally correspond to the size of the base 14 of the support structure 12. The hinges 24a, 24b, 24c of the side panels 22a, 22b, 22c, respectively, correspond to lateral edges of the base 14 of the support structure 12.

In FIG. 2D, the side panels 22a, 22b, 22c of the flexible-hybrid circuit 18 are folded on the support structure 12 so that the side panels of the flexible-hybrid circuit are positioned against the sides 16a, 16b, 16c of the support structure, respectively, to create the fully assembled flexible-hybrid circuit assembly 10. As shown, the side panel 22a, 22b, 22c of the flexible-hybrid circuit 18 is generally coplanar with their respective sides 16a, 16b, 16c of the support structure 12. The side panels 22a, 22b, 22c of the flexible-hybrid circuit 18 are folded about their respective hinges 24a, 24b, 24c to achieve the resulting structure. In one embodiment, the base panel 20 and the side panels 24a, 24b, 24c of the flexible-hybrid circuit assembly 10 can be secured or otherwise adhered to the respective base 14 and sides 16a, 16b, 16c of the support structure 12 to secure the flexible-hybrid circuit to the support structure. In some embodiments, the side panels 22a, 22b, 22c and the flexible circuit hinges 24a, 24b, 24c are created as one-piece. Fasteners can be provided to secure the flexible-hybrid circuit 18 to the support structure 12. In other embodiments, adhesives, including conductive epoxies, can be used to secure the flexible-hybrid circuit 18 to the support structure 12.

Figure 3:
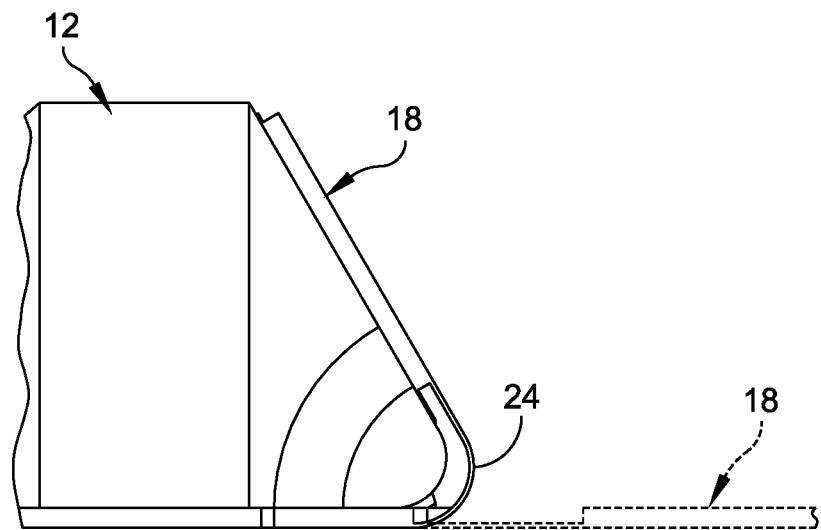
FIG. 3 is an enlarged cross-sectional view of a portion of the flexible-hybrid circuit assembly shown in FIG. 2D.

Referring to FIG. 3, each flexible circuit hinge 24 is flexible for DC and logic and an integrated waveguide for RF, which will be described in greater detail below. As shown, the flexible-hybrid circuit 18 is folded on the support structure 12 to create the flexible circuit hinge 24.

Figure 4A:
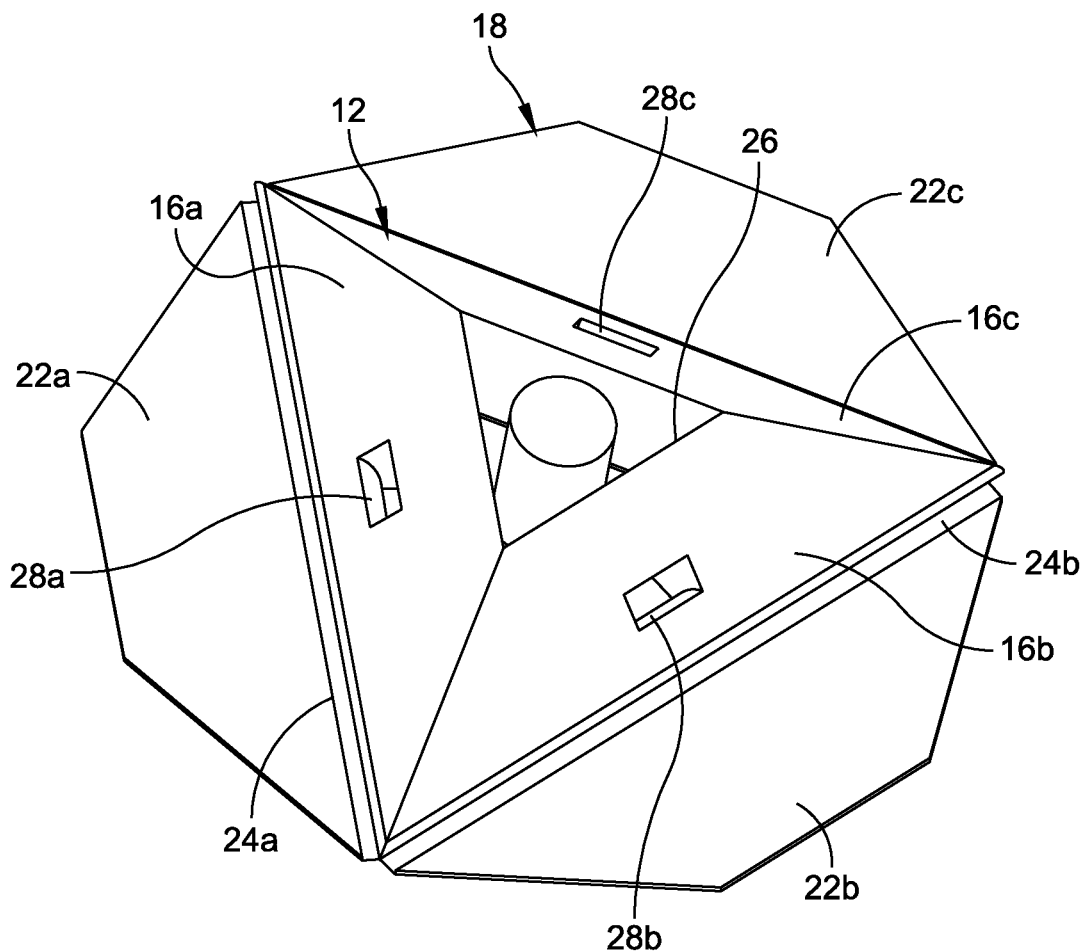
FIG. 4A is a perspective view of the flexible-hybrid circuit and the structural support prior to folding, with the structural support having a cavity to support internal components of the flexible-hybrid circuit.
Figure 4B:
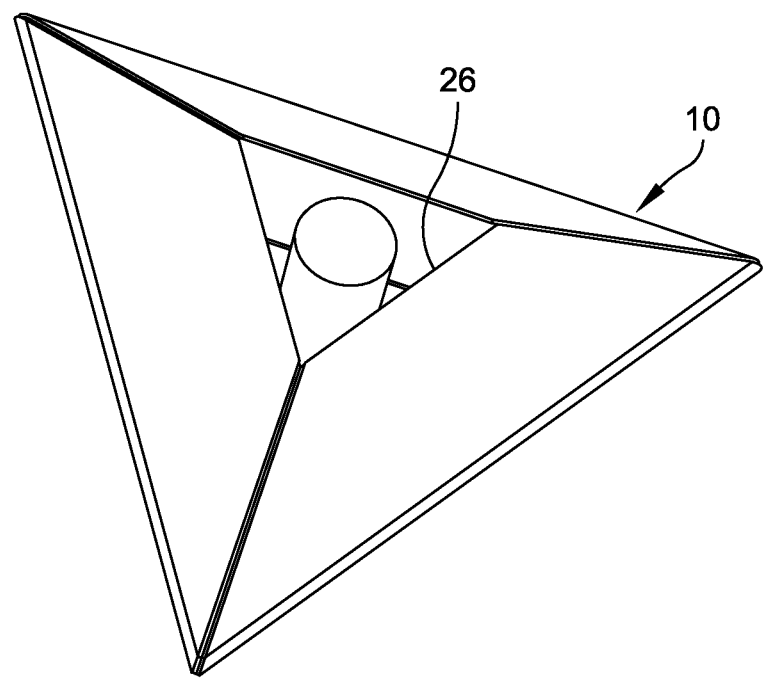
FIG. 4B is a perspective view of the flexible-hybrid circuit assembly shown in FIG. 4A, with the flexible-hybrid circuit being folded about the structural support.
Figure 4C:
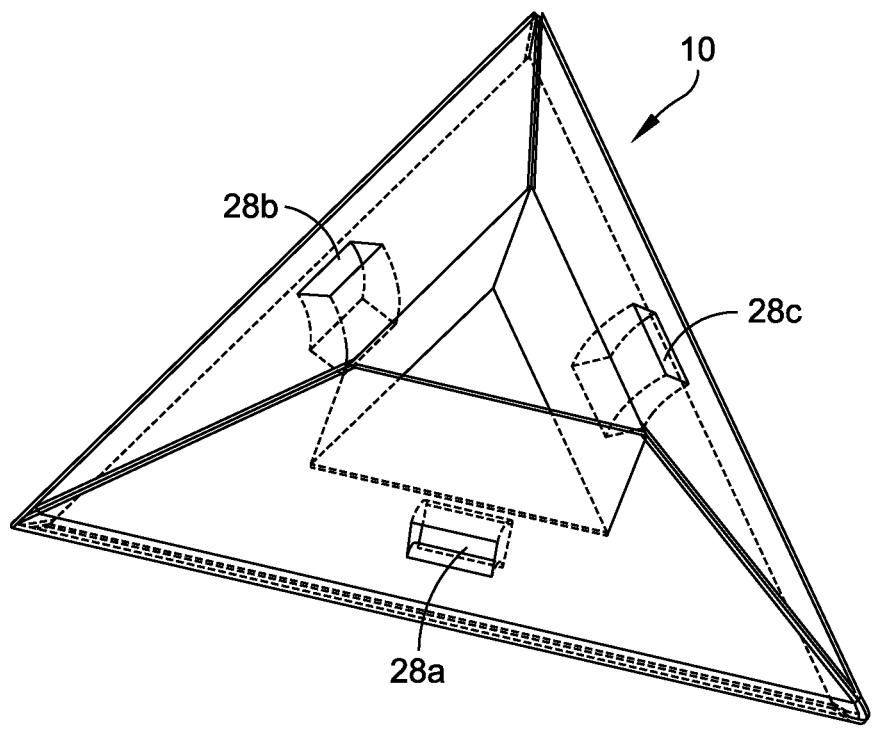
FIG. 4C is a perspective view of the flexible-hybrid circuit assembly shown in FIG. 4B, showing details of the assembly.

Referring to FIGS. 4A-4C, FIG. 4A shows the flexible-hybrid circuit and the support structure prior to folding. FIG. 4B shows the flexible-hybrid circuit folded about the support structure. As shown, the support structure 12 is configured with a cavity 26 configured to support internal components of the flexible-hybrid circuit assembly. In some embodiments, the internal components may include sensors (non-RF sensors), auxiliary components, gyroscopes, heat sinks or cooling modules, to name a few. The cavity of the support structure can be open or filled with a dielectric material.

Figure 5A:
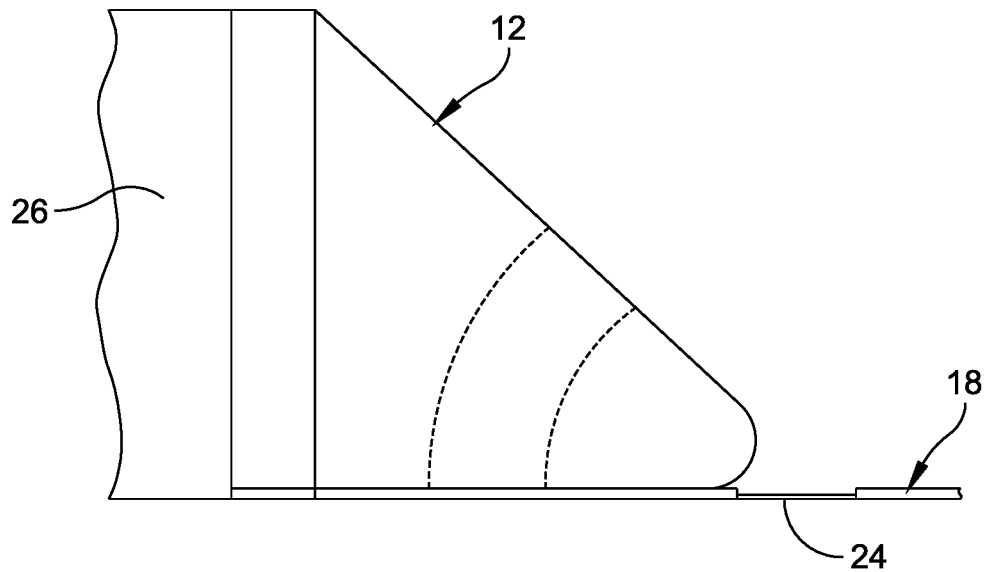
FIG. 5A is an enlarged cross-sectional view of a portion of the flexible-hybrid circuit and the structural support shown in FIG. 4A.
Figure 5B:
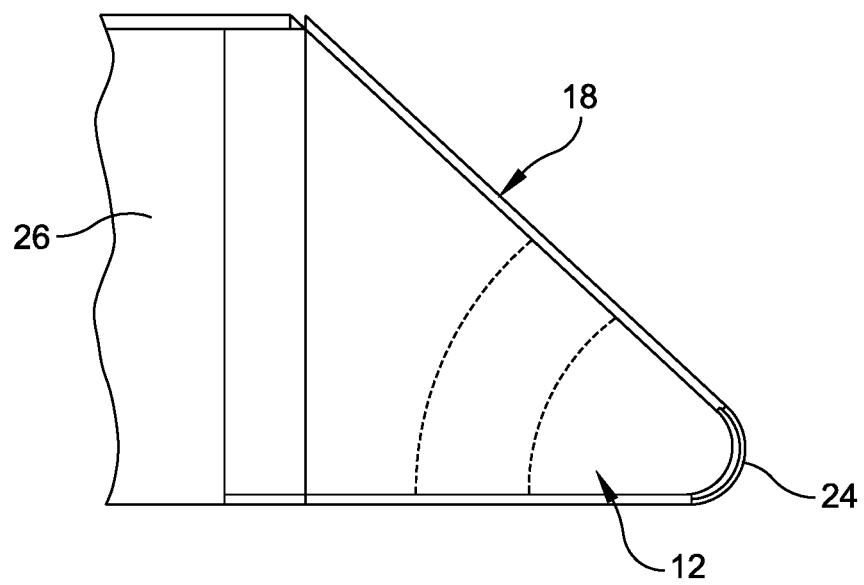
FIG. 5B is an enlarged cross-sectional view of a portion of the flexible-hybrid circuit assembly shown in FIG. 4B.

FIG. 4C shows waveguides, indicated at 28a, 28b, 28c, which is a structure that guides electromagnetic waves with minimal loss or energy by restricting transmission of energy in one direction. In some embodiments, the cavities in the support structure 12 that receive the waveguides 28a, 28b, 28c can be filled with dielectric material. As shown, although three waveguides 28a, 28b, 28c are provided, one for each side 16a, 16b, 16c of the flexible-hybrid circuit assembly 10, any number of waveguides can be provided. Referring to FIGS. 5A and 5B, each flexible circuit hinge 24 is flexible for DC and logic and an integrated waveguide for RF. FIG. 5A illustrates the flexible-hybrid circuit prior to folding. FIG. 5B illustrates the completed flexible-hybrid circuit assembly. Since the waveguides 28a, 28b, 28c are integrated into the support structure 12, the waveguides bridge parts of the flexible-hybrid circuit 18 and the support structure at each side of the resulting assembly 10.

Figure 6A:
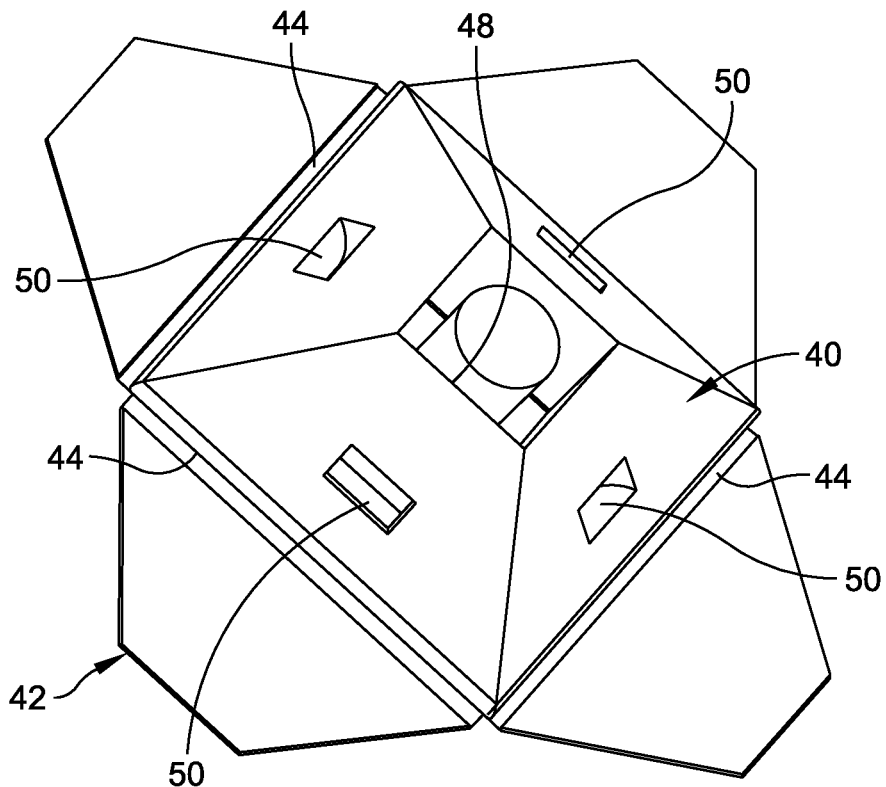
FIG. 6A is a perspective view of a flexible-hybrid circuit and a structural support of another embodiment of the disclosure prior to folding, with the structural support having a cavity to support internal components.
Figure 6B:
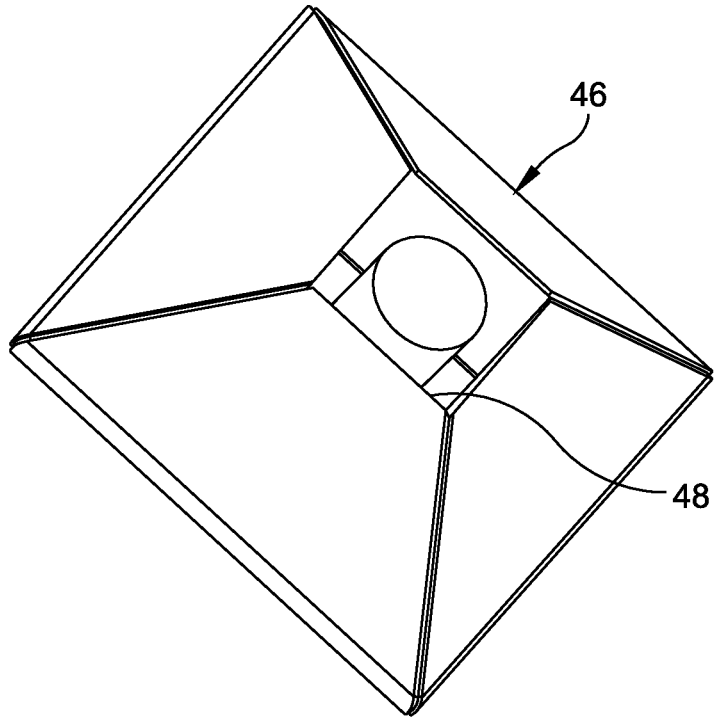
FIG. 6B is a perspective view of the flexible-hybrid circuit and the structural support shown in FIG. 6A, with the flexible-hybrid circuit being folded about the structural support to create a flexible-hybrid circuit assembly.
Figure 6C:
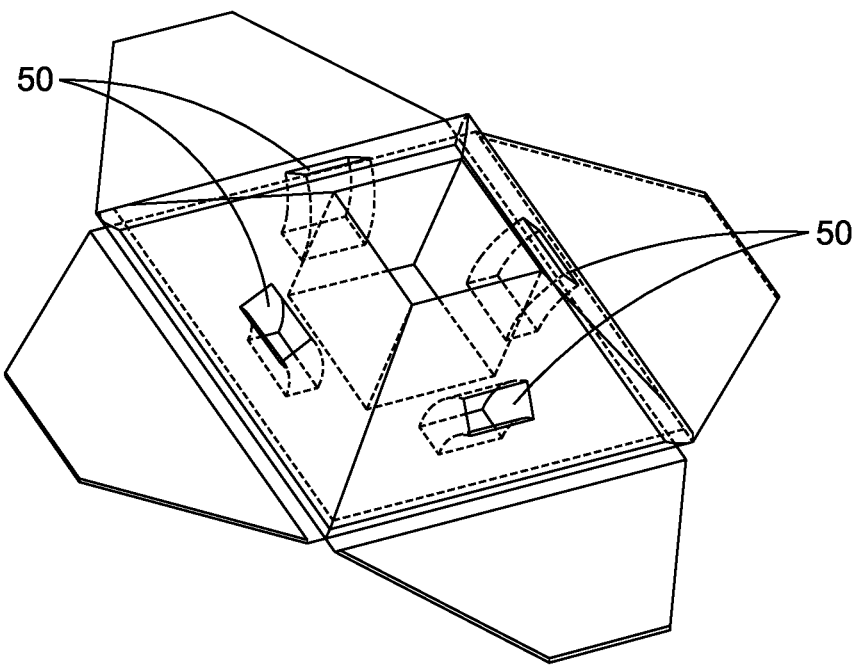
FIG. 6C is a perspective view of the flexible-hybrid circuit and the structural support shown in FIG. 6A, showing details of the structural support.

Referring to FIGS. 6A-6C, a four sided pyramidic-shaped support structure is generally indicated at 40. As shown, the support structure 40 includes a four-sided base and four three-sided sides that form the shape of the four sided pyramid. A flexible-hybrid circuit is generally indicated at 42. As shown, the flexible-hybrid circuit 42 is shaped to fold about the support structure. Specifically, the flexible-hybrid circuit 42 includes a four-sided base panel that is sized and shaped to receive the base of the support structure and four three-sided side panels that are sized and shaped to be received on respective sides of the support structure. The side panels of the flexible-hybrid circuit 42 are hingedly connected to one another by flexible circuit hinges, each indicated at 44, that provide electrical and mechanical connections between the base panel and the side panels.

In FIG. 6A, the support structure 40 is placed on the flexible-hybrid circuit 42, with the base of the support structure being placed on the base panel of the flexible-hybrid circuit. As shown, the base panel of the flexible-hybrid circuit 42 is sized to generally correspond to the size of the base of the support structure 40. The flexible circuit hinges 44 of the side panels correspond to lateral edges of the base of the support structure.

In FIG. 6B, the side panels of the flexible-hybrid circuit 42 are folded on the support structure 40 so that the side panels of the flexible-hybrid circuit are positioned against the sides of the support structure to create a fully assembled flexible-hybrid circuit assembly, generally indicated at 46. The side panels of the flexible-hybrid circuit 42 are folded about their respective hinges about the sides of the support structure 40 to achieve the resulting structure 46.

As shown, the flexible-hybrid circuit assembly 46 further includes a cavity 48 configured to support internal components and several waveguides, each indicated at 50. As shown, the waveguides 50 are provided on each side of the support structure 40. FIG. 6C illustrates this configuration. In some embodiments, the cavities that receive the waveguides 50 can be filled with dielectric material.

Figure 7A:
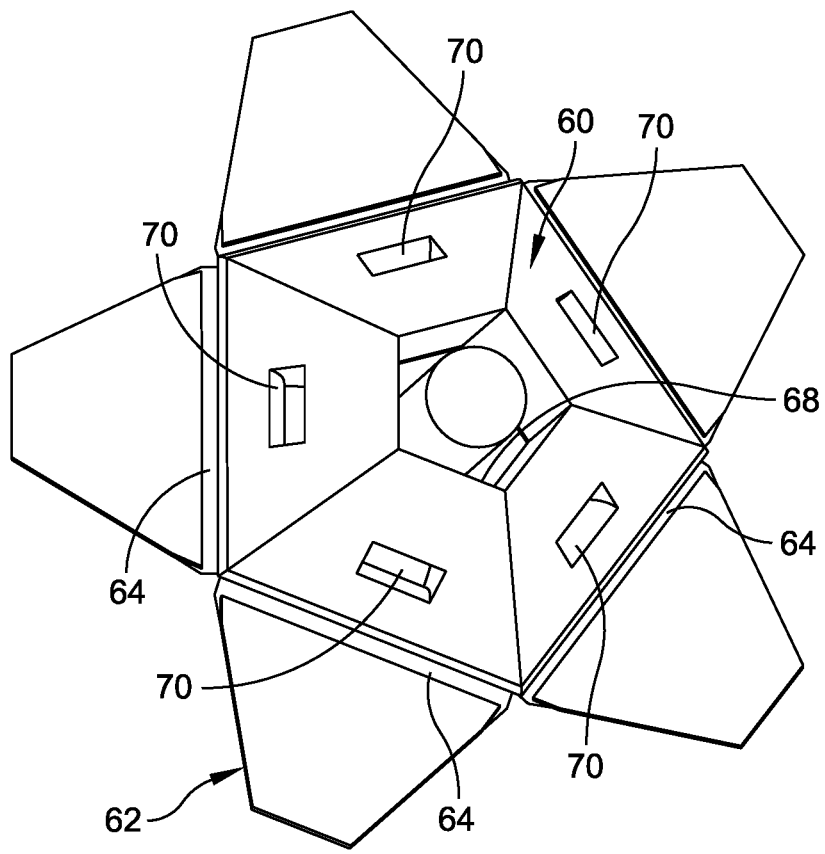
FIG. 7A is a perspective view of a flexible-hybrid circuit and a structural support of another embodiment of the disclosure prior to folding, with the structural support having a cavity to support internal components.
Figure 7B:
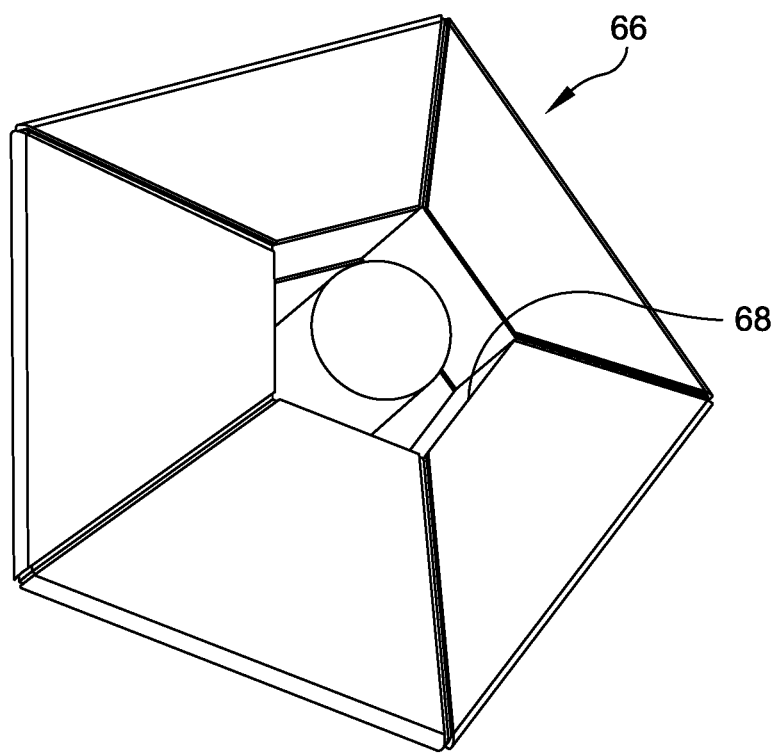
FIG. 7B is a perspective view of the flexible-hybrid circuit and the structural support shown in FIG. 7A, with the flexible-hybrid circuit being folded about the structural support to create a flexible-hybrid circuit assembly.
Figure 7C:
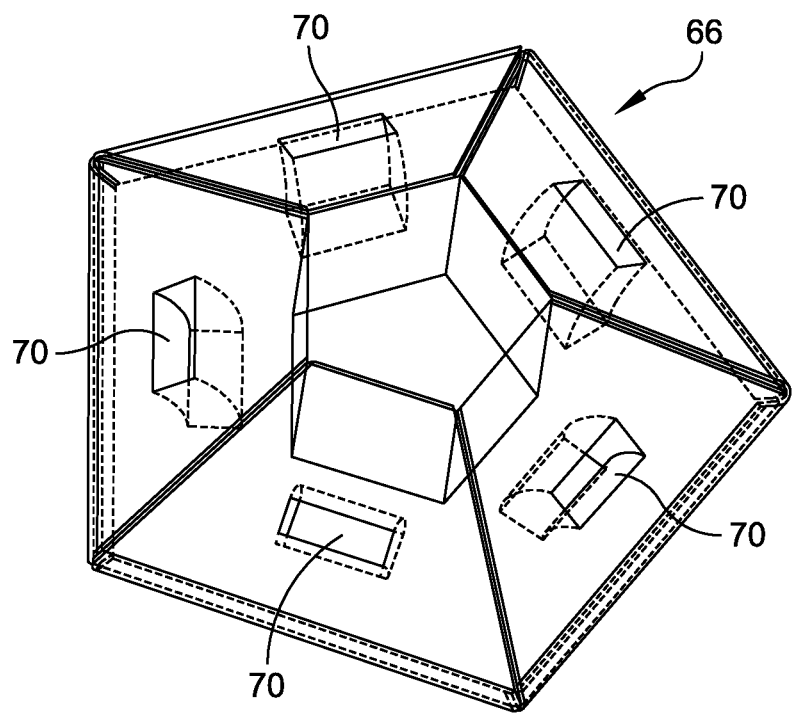
FIG. 7C is a perspective view of the flexible-hybrid circuit assembly shown in FIG. 7B, showing details of the assembly.

Referring to FIGS. 7A-7C, a five sided support structure is generally indicated at 60. As shown, the pentagon-shaped support structure 60 includes a five-sided base and five three-sided sides that form the shape of the five sided pentagon. A flexible-hybrid circuit is generally indicated at 62. As shown, the flexible-hybrid circuit 62 is shaped to fold about the support structure 60. Specifically, the flexible circuit 62 includes a five-sided base panel that is sized and shaped to receive the base of the support structure 60 and five three-sided side panels that are sized and shaped to be received on respective sides of the support structure. The panels of the flexible-hybrid circuit 62 are hingedly connected to one another by flexible circuit hinges, each indicated at 64, that provide electrical and mechanical connections between the base panel and the panels of the flexible-hybrid circuit.

In FIG. 7A, the support structure 60 is placed on the flexible-hybrid circuit 62, with the base of the support structure being placed on the base panel of the flexible-hybrid circuit. As shown, the base panel of the flexible-hybrid circuit is sized to generally correspond to the size of the base of the support structure. The flexible-hybrid circuit hinges 64 of the side panels of the flexible-hybrid circuit 62 correspond to lateral edges of the base of the support structure 60.

In FIG. 7B, the side panels of the flexible-hybrid circuit 62 are folded on the support structure 60 so that the side panels of the flexible-hybrid circuit are positioned against the sides of the support structure to create a fully assembled flexible-hybrid circuit assembly, generally indicated at 66. The side panels are folded about their respective flexible-hybrid circuit hinges 64 to achieve the resulting structure 66.

As shown, the flexible-hybrid circuit assembly 66 further includes a cavity configured to support internal components and several waveguides, each indicated at 70. As shown, the waveguides 70 are provided on each side of the support structure 60. FIG. 7C illustrates this configuration. In some embodiments, the cavities that receive the waveguides 70 can be filled with dielectric material.

Figure 8A:
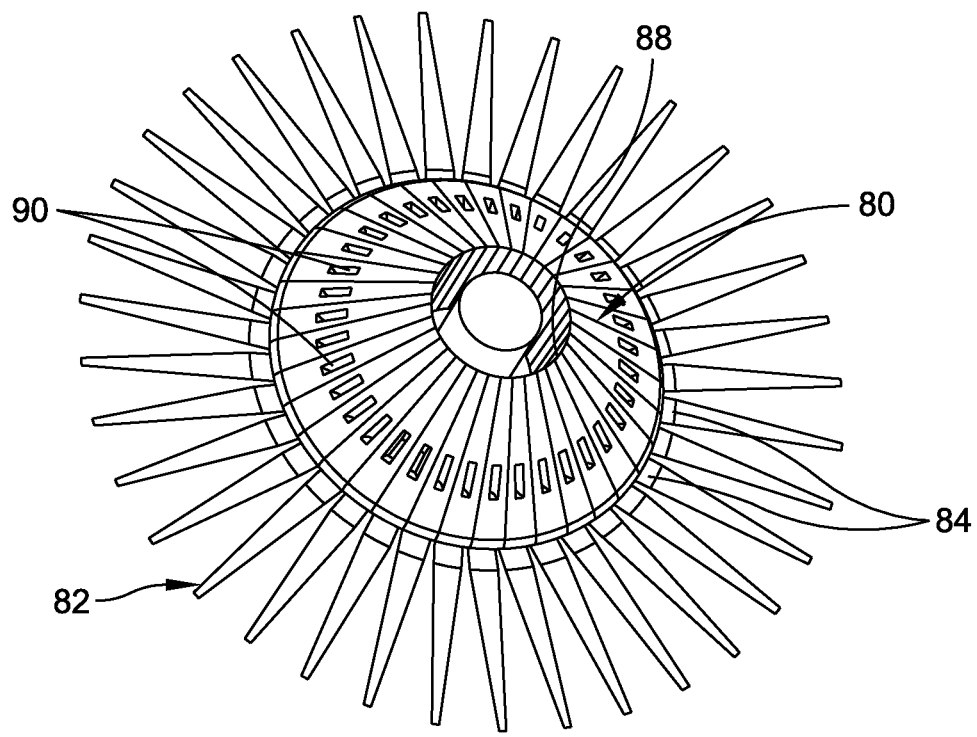
FIG. 8A is a perspective view of a flexible-hybrid circuit and a structural support of another embodiment of the disclosure prior to folding, with the structural support having a cavity to support internal components.
Figure 8B:
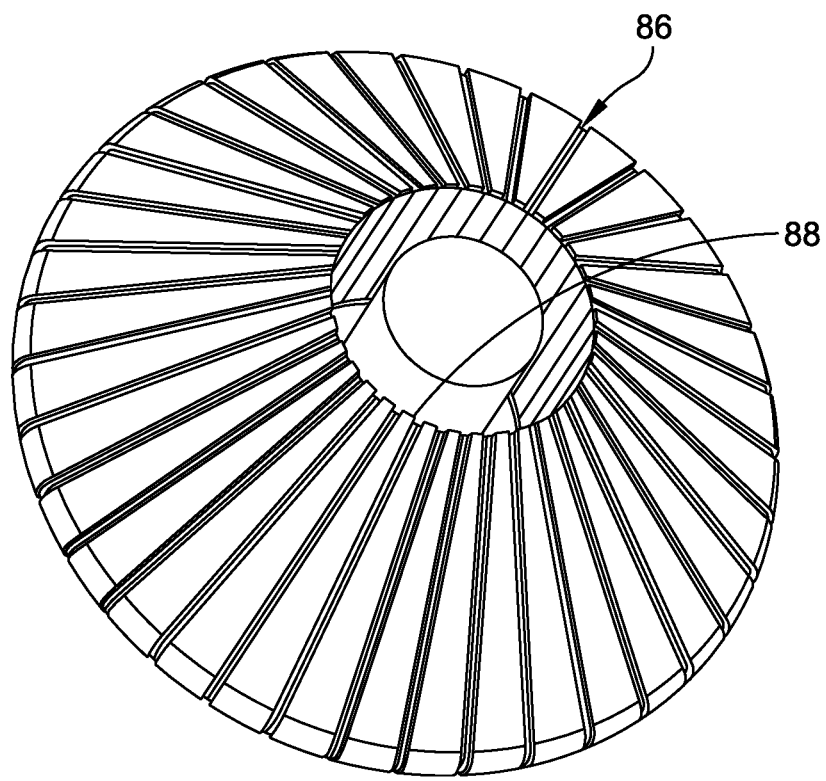
FIG. 8B is a perspective view of the flexible-hybrid circuit and the structural support shown in FIG. 8A, with the flexible-hybrid circuit being folded about the structural support to create a flexible-hybrid circuit assembly.
Figure 8C:
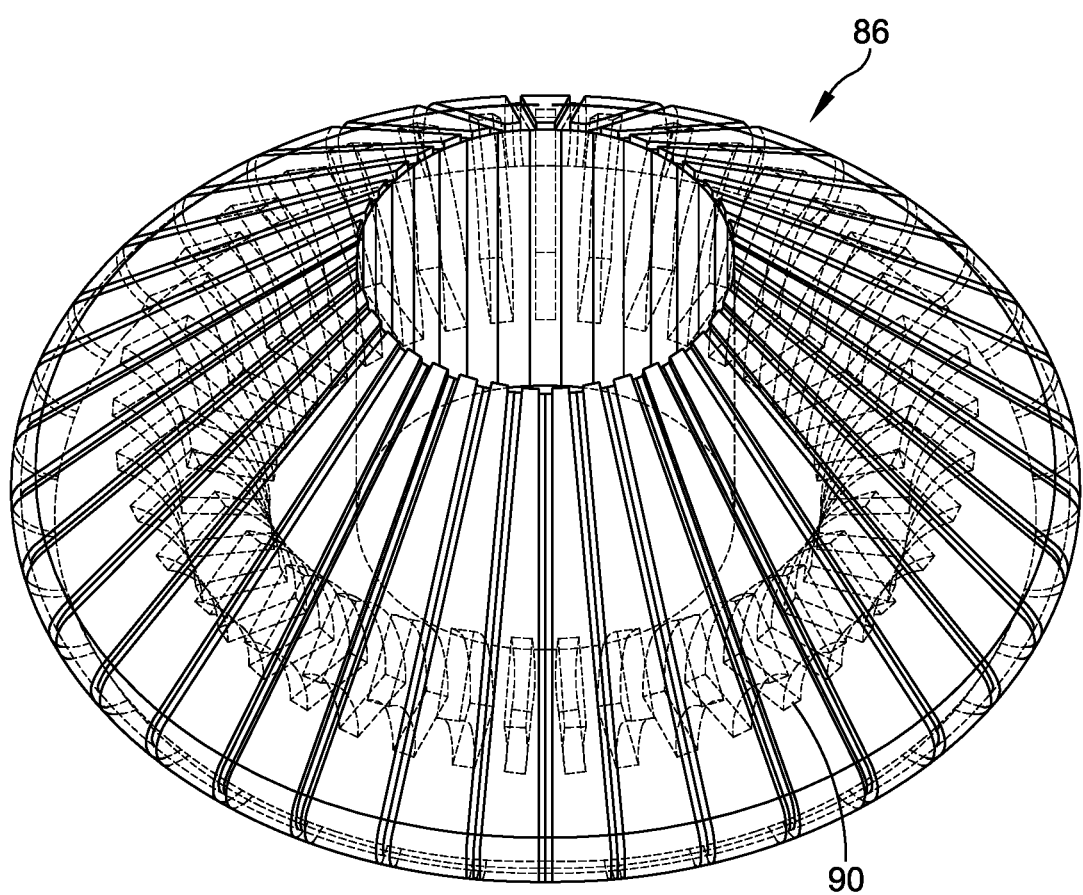
FIG. 8C is a perspective view of the flexible-hybrid circuit assembly shown in FIG. 8B, showing details of the assembly.

Referring to FIGS. 8A-8C, a cone-shaped support structure is generally indicated at 80. As shown, the cone-shaped support structure 80 includes a circular base. A flexible-hybrid circuit is generally indicated at 82. As shown, the flexible-hybrid circuit 82 is shaped to fold about the support structure 80. Specifically, the flexible-hybrid circuit 82 includes a circular base panel, which is sized and shaped to receive the base of the support structure 80, and a plurality of elongate triangularly-shaped side panels, e.g., thirty-six, which are hingedly connected to the base panel. The side panels of the flexible-hybrid circuit 82 are hingedly connected to one another by flexible-hybrid circuit hinges, each indicated at 84, that provide electrical and mechanical connections between the panels.

In FIG. 8A, the support structure 80 is placed on the flexible-hybrid circuit 82, with the base of the support structure being placed on the base panel of the flexible-hybrid circuit. As shown, the base panel of the flexible-hybrid circuit 82 is sized to generally correspond to the size of the base of the support structure 80. The hinges 84 of the base panel and the side panels of the flexible-hybrid circuit correspond to lateral edges of the base of the support structure 80.

In FIG. 8B, the side panels of the flexible-hybrid circuit 82 are folded on the support structure 80 so that the side panels of the flexible-hybrid circuit are positioned against the sides of the support structure to create a fully assembled flexible-hybrid circuit assembly, generally indicated at 86. The side panels of the flexible-hybrid circuit 82 are folded about their respective hinges 84 to achieve the resulting structure 86.

As shown, the flexible-hybrid circuit assembly 86 further includes a cavity 88 configured to support internal components and several waveguides, each indicated at 90. As shown, the waveguides 90 are provided on each side of the support structure 80. FIG. 8C illustrates this configuration. In some embodiments, the cavities that receive the waveguides 90 can be filled with dielectric material.

It should be observed that antenna structures manufactured in accordance with methods of embodiments of the present disclosure can allow active RF seekers that can simultaneously transmit and receive electromagnetic radiation in multiple directions.

In some embodiments, the antenna structures can achieve minimal RF scattering especially with multimode seekers.

In some embodiments, the antenna structures can enable manufacturing of the non-planar array without the need for miniature connectors that are difficult or impossible to assemble.

In some embodiments, the antenna structures can be configured to be tilted to enable larger field of views.

In some embodiments, the antenna structures include an integrated waveguide to allow for high performance RF interface, and provide a thermal and structural load path.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

The invention claimed is:

1. A method of fabricating a printed circuit assembly, the method comprising:
providing a flexible-hybrid circuit having a base and at least one side panel, the at least one side panel being hingedly connected to the base;
disposing a support structure on the flexible-hybrid circuit, the support structure including a base, which is disposed on the base of the flexible-hybrid circuit, and at least one side that corresponds to the at least one side panel of the flexible-hybrid circuit; and
folding the at least one side panel of the flexible-hybrid circuit so that the at least one side panel is disposed co-planar with the at least one side of the support structure to create a printed circuit assembly,
wherein the support structure further includes at least one waveguide.

2. The method of claim 1, wherein the base of the support structure includes a three-sided base and the at least one side of the support structure includes three three-sided sides that together form the shape of a three-sided pyramid.

3. The method of claim 2, wherein the flexible-hybrid circuit includes a three-sided base panel that is sized and shaped to receive the base of the support structure and three three-sided side panels that are sized and shaped to be receive on respective sides of the support structure.

4. The method of claim 3, wherein the base panel and each side panel of the flexible-hybrid circuit are fabricated from a PCB, with each side panel being hingedly connected to the base panel by flexible-hybrid circuits that provide electrical and mechanical connections.

5. The method of claim 4, wherein each hinge includes a thin insulating polymer film having conductive circuit patterns affixed thereto and typically supplied with a thin polymer coating to product the conductor circuits.

6. The method of claim 1, further comprising securing the at least side panel of the flexible-hybrid circuit to the at least one side of the support structure by one or more fasteners.

7. The method of claim 1, wherein the support structure further includes at least one of a sensor, auxiliary electronics, a gyroscope or a cooling module.

8. The method of claim 1, wherein the base of the support structure includes a polynomial-sided base and the at least one side of the support structure includes a corresponding polynomial-sided sides that together form the shape of a three-dimensional object.

9. The method of claim 8, wherein the flexible-hybrid circuit includes a polynomial-sided base panel that is sized and shaped to receive the polynomial-sided base of the support structure and a corresponding number of polynomial-sided side panels that are sized and shaped to be received on respective sides of the support structure.

10. The method of claim 9, wherein the base panel and each side panel of the flexible-hybrid circuit are fabricated from a PCB, with each side panel being hingedly connected to the base panel by flexible-hybrid circuits that provide electrical and mechanical connections.

11. A printed circuit assembly comprising:
a flexible-hybrid circuit having a base and at least one side panel, the at least one side panel being hingedly connected to the base; and
a support structure on the flexible-hybrid circuit, the support structure including a base, which is disposed on the base of the flexible-hybrid circuit when assembling the flexible-hybrid circuit and the support structure, and at least one side that corresponds to the at least one side panel of the flexible-hybrid circuit,
wherein the at least one side panel of the flexible-hybrid circuit is configured to be folded so that the at least one side panel is disposed co-planar with the at least one side of the support structure to create the printed circuit assembly, and
wherein the support structure further includes at least one waveguide.

12. The assembly of claim 11, wherein the base of the support structure includes a three-sided base and the at least one side of the support structure includes three three-sided sides that together form the shape of a three-sided pyramid.

13. The assembly of claim 12, wherein the flexible-hybrid circuit includes a three-sided base panel that is sized and shaped to receive the base of the support structure and three three-sided side panels that are sized and shaped to be receive on respective sides of the support structure.

14. The assembly of claim 13, wherein the base panel and each side panel of the flexible-hybrid circuit are fabricated from a PCB, with each side panel being hingedly connected to the base panel by flexible-hybrid circuits that provide electrical and mechanical connections.

15. The assembly of claim 14, wherein each hinge includes a thin insulating polymer film having conductive circuit patterns affixed thereto and typically supplied with a thin polymer coating to product the conductor circuits.

16. The assembly of claim 11, wherein the support structure further includes one or more components.

17. The assembly of claim 16, wherein the one or more components includes one of a sensor, auxiliary electronics, a gyroscope or a cooling module.

18. The assembly of claim 11, wherein the base of the support structure includes a polynomial-sided base and the at least one side of the support structure includes a corresponding polynomial-sided sides that together form the shape of a three-dimensional object, and wherein the flexible-hybrid circuit includes a polynomial-sided base panel that is sized and shaped to receive the polynomial-sided base of the support structure and a corresponding number of polynomial-sided side panels that are sized and shaped to be received on respective sides of the support structure.

19. The assembly of claim 18, wherein the base panel and each side panel of the flexible-hybrid circuit are fabricated from a PCB, with each side panel being hingedly connected to the base panel by flexible-hybrid circuits that provide electrical and mechanical connections.

* * * * *